United States Patent
Uyeno et al.

(10) Patent No.: US 11,042,025 B2
(45) Date of Patent: Jun. 22, 2021

(54) OPTICAL DATA COMMUNICATION USING MICRO-ELECTRO-MECHANICAL SYSTEM (MEMS) MICRO-MIRROR ARRAYS

(71) Applicant: Raytheon Company, Waltham, MA (US)

(72) Inventors: Gerald P. Uyeno, Tucson, AZ (US); Sean D. Keller, Tucson, AZ (US); Benn H. Gleason, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/871,602

(22) Filed: May 11, 2020

(65) Prior Publication Data
US 2021/0088776 A1    Mar. 25, 2021

Related U.S. Application Data

(60) Provisional application No. 62/903,244, filed on Sep. 20, 2019.

(51) Int. Cl.
*G02B 26/08* (2006.01)
*H04J 14/02* (2006.01)
(Continued)

(52) U.S. Cl.
CPC ....... *G02B 26/0841* (2013.01); *G02B 6/3512* (2013.01); *H04J 14/0267* (2013.01); *H04Q 11/0005* (2013.01)

(58) Field of Classification Search
CPC ............... G02B 26/0841; G02B 6/3512; H04J 14/0267; H04Q 11/0005
(Continued)

(56) References Cited

U.S. PATENT DOCUMENTS

| 6,567,574 B1 * | 5/2003 | Ma ..................... H04Q 11/0005 385/16 |
| 7,660,235 B2 * | 2/2010 | Alicherry ................ H04L 45/28 370/217 |

(Continued)

OTHER PUBLICATIONS

"Mirrorcle Technologies MEMS Mirrors—Technical Overview", Mirrorcle Technologies, Inc., (2018), 7 pgs.

*Primary Examiner* — Dalzid E Singh
(74) *Attorney, Agent, or Firm* — Schwegman Lundberg & Woessner, P.A.

(57) ABSTRACT

Embodiments of an optical data communication apparatus using micro-electro-mechanical system (MEMS) micro-mirror arrays is described herein. The apparatus may include a router configured to operate as a relay to exchange optical data signals between optical switches of the apparatus. The optical switches may be configured to switch between reflection directions to reflect the optical signals over different optical connections between the optical switches and different receiving ports of the router. The reflection directions may be switched in accordance with predetermined mappings between the receiving ports of the router and destinations of the optical signals. The router includes a MEMS micro-mirror array configured to reflect received optical signals to the destinations. A processing element of the optical data switching circuitry may generate a plurality of optical data signals and may send the optical data signals to an optical switch of the optical data switching circuitry.

28 Claims, 7 Drawing Sheets

(51) Int. Cl.
*H04Q 11/00* (2006.01)
*G02B 6/35* (2006.01)

(58) Field of Classification Search
USPC .......................................................... 398/48
See application file for complete search history.

(56) References Cited

U.S. PATENT DOCUMENTS

| | | | |
|---|---|---|---|
| 8,983,293 B2 * | 3/2015 | Frankel | G02B 6/26 398/50 |
| 9,473,768 B2 | 10/2016 | Uyeno et al. | |
| 10,243,654 B1 | 3/2019 | Uyeno et al. | |
| 10,444,492 B2 | 10/2019 | Hopkins et al. | |
| 2002/0141689 A1 * | 10/2002 | Qian | G02B 6/3588 385/18 |
| 2003/0081321 A1 * | 5/2003 | Moon | G02B 6/2931 359/619 |
| 2003/0185488 A1 * | 10/2003 | Blumenthal | H04Q 11/0005 385/16 |
| 2005/0031255 A1 * | 2/2005 | Schroeder | G02B 6/359 385/18 |
| 2007/0036480 A1 * | 2/2007 | Wu | G02B 6/3556 385/16 |
| 2008/0050064 A1 * | 2/2008 | Sakai | H04Q 11/0005 385/17 |
| 2012/0155885 A1 * | 6/2012 | Hannah | H04B 10/1143 398/128 |
| 2015/0172218 A1 * | 6/2015 | Beshai | H04J 14/0267 370/401 |
| 2017/0293137 A1 * | 10/2017 | Zhao | G02B 26/08 |
| 2018/0231715 A1 * | 8/2018 | Bishop | G02B 26/02 |
| 2019/0154921 A1 * | 5/2019 | Xing | G02B 6/3502 |

\* cited by examiner

OPTICAL DATA COMMUNICATION USING MICRO-ELECTRO-MECHANICAL SYSTEM (MEMS) MICRO-MIRROR ARRAYS

PRIORITY CLAIM

This application claims priority to U.S. Provisional Patent Application Ser. No. 62/903,244, filed Sep. 20, 2019 [reference number 19-13085-US-PSP] which is incorporated herein by reference in its entirety.

TECHNICAL FIELD

Embodiments pertain to optical data switching and data communications using Micro-Electro-Mechanical Systems (MEMS) micro-mirror arrays.

BACKGROUND

In some systems, processing elements may exchange signals with each other to communication results, outputs or other information. For instance, operations performed by a particular processing element of a system may be output to another processing element. In some cases, the other processing element may be at another physical location of the system, such as on a different processor board. Communication between elements in such scenarios may be challenging due to any number of factors. As an example, the number of processing elements in the system may be high or may increase and the number of required exchanges is even higher, increasing as the square of the number of processing elements. As another example, delays in communication of information between processing elements may affect system performance. Accordingly, there is a general need for systems and methods to enable rapid signal switching between large numbers of processing elements in these and other scenarios.

DETAILED DESCRIPTION

The following description and the drawings sufficiently illustrate specific embodiments to enable those skilled in the art to practice them. Some embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
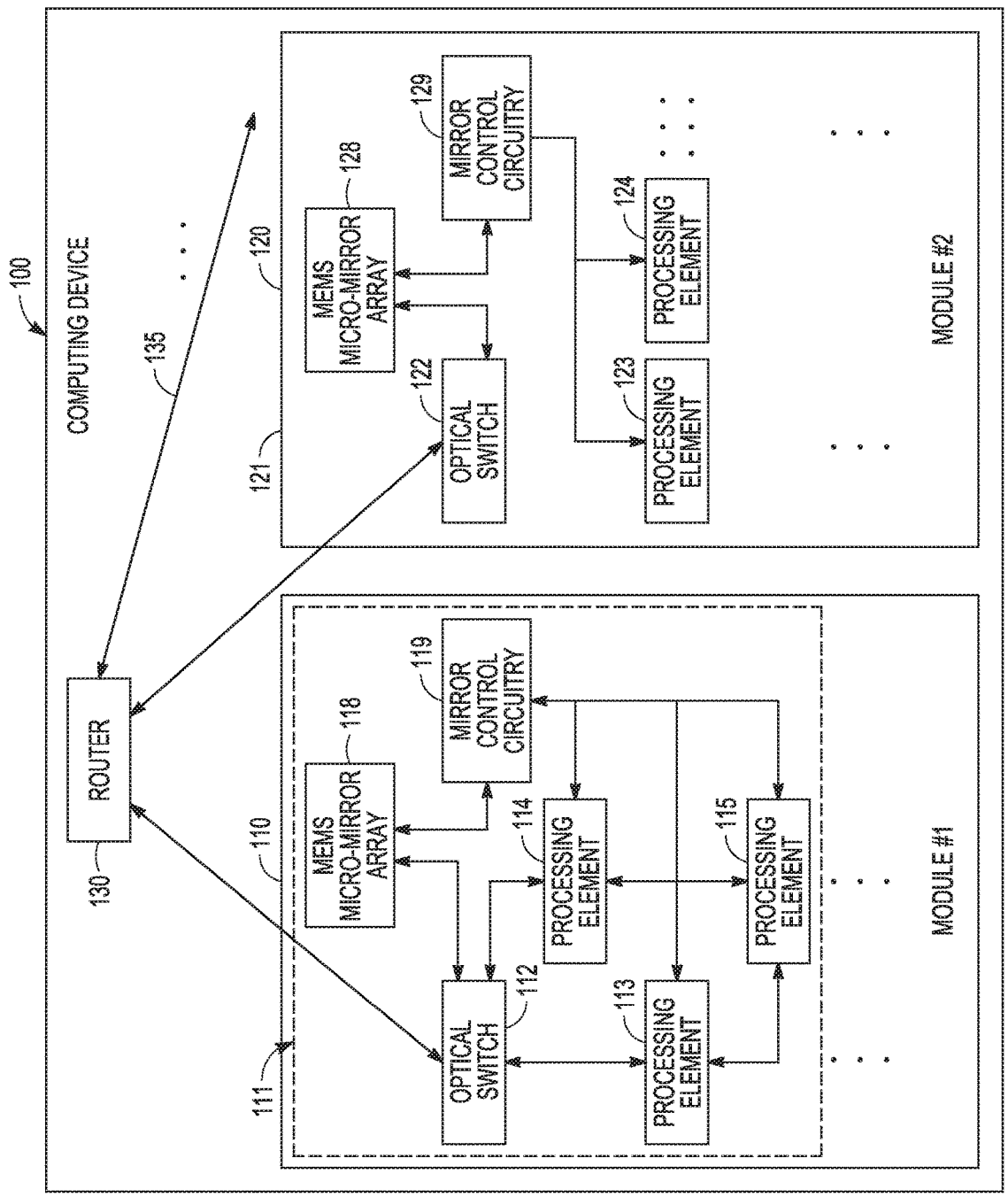
FIG. 1 illustrates an example of a computing device in accordance with some embodiments.

FIG. 1 illustrates an example of a computing device in accordance with some embodiments. It should be noted that embodiments are not limited to the example computing device 100 shown in FIG. 1, in terms of number, type and/or arrangement of components. Some embodiments may not necessarily include all components shown in the example computing device 100. Some embodiments may include additional components not shown in the example computing device 100. In some embodiments, one or more components may be used in place of one or more components shown in the example computing device 100 and may provide same or similar functionality to components shown in the example computing device 100.

The example computing device 100 may include any number of modules, such as the first module 110 and the second module 110. It should be noted that embodiments are not limited to two modules 110, 120, as any suitable number of modules may be included in the computing device 100. The first module 110 may include an optical switch 112 and one or more processing elements 113-115, which may be connected through interface circuitry (such as 116) which may include optical circuitry, waveguides, wires and/or a combination thereof. It should be noted that embodiments are not limited to the examples of connectivity shown between processing elements 113-115 or between the optical switch 112 and the processing elements 113-115. The first module 110 may also include additional components. In accordance with some embodiments, the optical switch 112 may exchange optical signals with the router 130. These embodiments will be described in more detail below.

The second module 120 may include an optical switch 122, one or more processing elements (such as 123, 124 and/or others) and/or other components. In some embodiments, the optical switch 122 may exchange optical signals with the router 130, as will be described herein. The router 130 may also exchange optical signals with any suitable number of other modules and/or components, in some embodiments.

As used herein, the term "circuitry" may refer to, be part of, or include optical components, an optical circuit, an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware. Embodiments described herein may be implemented into a system using any suitably configured hardware and/or software.

Figure 2:
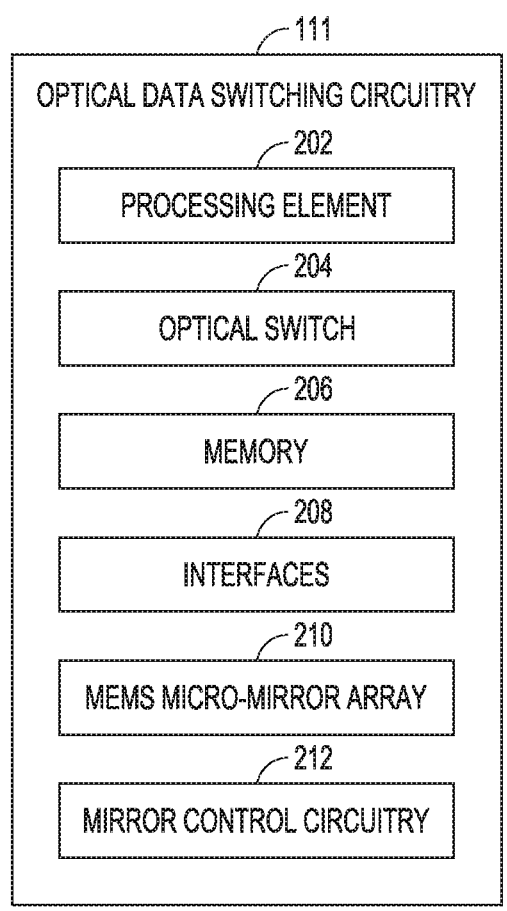
FIG. 2 illustrates an example of optical data switching circuitry in accordance with some embodiments.

FIG. 2 illustrates an example of optical data switching circuitry in accordance with some embodiments. The optical data switching circuitry 111 may include one or more processing elements 202 and one or more optical switches 204, in some embodiments. In some embodiments, optical data switching circuitry 111 may include one or more micro-electrical mechanical (MEMS) micro-mirror arrays 118 and mirror control circuitry 119. In some embodiments, the optical switch 204 may include one or more MEMS micro-mirror arrays 118 and mirror control circuitry 119. Referring to FIG. 1, the optical switch 112 and the processing elements 113-115 may be included as part of the optical data switching circuitry 111 included in the first module 110, in some cases. Similarly, the optical switch 122 and the processing elements 123 and 124 may be included as part of an optical data switching circuitry included in the second module 120, in some cases. The optical data switching circuitry 111 may also include memory 206 in some embodiments, which may be used by the optical data switching circuitry 111 as part of the performance of some of the operations described herein. The optical data switching circuitry 111 may also include one or more interfaces 208 in some embodiments, which may enable communication between components of the optical data switching circuitry 111. In some embodiments, the interfaces 208 may enable communication between one or more components of the optical data switching circuitry 111 and one or more external components. The interfaces 208 may include wired interfaces, optical interfaces, waveguides or a combination thereof, in some embodiments.

Figure 3:
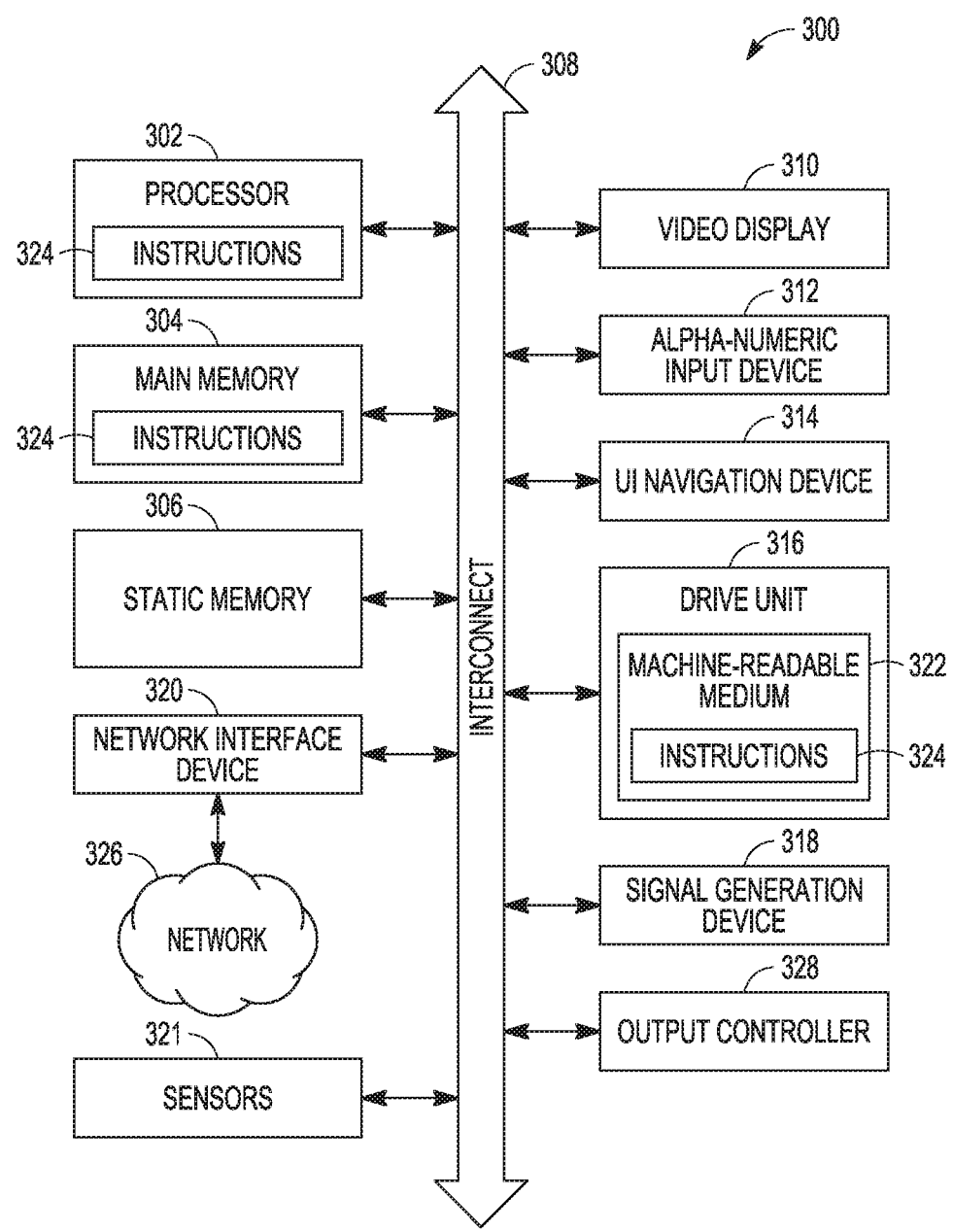
FIG. 3 illustrates a block diagram of an example machine in accordance with some embodiments.

FIG. 3 illustrates a block diagram of an example machine in accordance with some embodiments. Any one or more of the techniques (e.g., methodologies) discussed herein may be performed on such a machine 300, in some embodiments. In alternative embodiments, the machine 300 may operate as a standalone device or may be connected (e.g., networked) to other machines. In a networked deployment, the machine 300 may operate in the capacity of a server machine, a client machine, or both in server-client network environments. In an example, the machine 300 may act as a peer machine in peer-to-peer (P2P) (or other distributed) network environment. In some embodiments, the machine 300 may be a personal computer (PC), a tablet PC, a set-top box (STB), a personal digital assistant (PDA), a mobile device, a base station, an access point (AP) arranged to operate in accordance with an IEEE 802.11 protocol and/or a wireless local area network (WLAN) protocol, a station (STA) arranged to operate in accordance with an IEEE 802.11 protocol and/or a wireless local area network (WLAN) protocol, a User Equipment (UE) arranged to operate in accordance with a cellular or Third Generation Partnership Project (3GPP) protocol (including Long Term Evolution (LTE) protocols), an Evolved Node-B (eNB) arranged to operate in accordance with a 3GPP protocol (including LTE protocols), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

As a non-limiting example, a module may include a group of components connected to (permanently, temporarily and/or semi-permanently) a circuit board, processor board and/or other medium.

Machine (e.g., computer system) 300 may include a hardware processor 302 (e.g., a central processing unit (CPU), a graphics processing unit (GPU), a hardware processor core, or any combination thereof), a main memory 304 and a static memory 306, some or all of which may communicate with each other via an interconnect (e.g., bus) 308. In some embodiments, components of the machine 300 may communicate with each other via optical interfaces, waveguides and/or other circuitry configured to exchange optical signals. In some embodiments, the interconnect 308 may be configured to communicate optical signals and/or other signals between components of the machine 300.

The machine 300 may further include a display unit 310, an alphanumeric input device 312 (e.g., a keyboard), and a user interface (UI) navigation device 314 (e.g., a mouse). In an example, the display unit 310, input device 312 and UI navigation device 314 may be a touch screen display. The machine 300 may additionally include a storage device (e.g., drive unit) 316, a signal generation device 318 (e.g., a speaker), a network interface device 320, and one or more sensors 321, such as a global positioning system (GPS) sensor, compass, accelerometer, or other sensor. The machine 300 may include an output controller 328, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 316 may include a machine readable medium 322 on which is stored one or more sets of data structures or instructions 324 (e.g., software) embodying or utilized by any one or more of the techniques or functions described herein. The instructions 324 may also reside, completely or at least partially, within the main memory 304, within static memory 306, or within the hardware processor 302 during execution thereof by the machine 300. In an example, one or any combination of the hardware processor 302, the main memory 304, the static memory 306, or the storage device 316 may constitute machine readable media.

While the machine readable medium 322 is illustrated as a single medium, the term "machine readable medium" may include a single medium or multiple media (e.g., a centralized or distributed database, and/or associated caches and servers) configured to store the one or more instructions 324.

The term "machine readable medium" may include any medium that is capable of storing, encoding, or carrying instructions for execution by the machine 300 and that cause the machine 300 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine-readable media. In some examples, machine readable media may include machine readable media that is not a transitory propagating signal.

The instructions 324 may further be transmitted or received over a communications network 326 using a transmission medium via the network interface device 320 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 320 may include one or more physical jacks (e.g., Ethernet, coaxial, or phone jacks) or one or more antennas to connect to the communications network 326. In an example, the network interface device 320 may include a plurality of antennas to wirelessly communicate using at least one of single-input multiple-output (SIMO), multiple-input multiple-output (MIMO), or multiple-input single-output (MISO) techniques. In some examples, the network interface device 320 may wirelessly communicate using Multiple User MIMO techniques. The term "transmission medium" shall be taken to include any intangible medium that is capable of storing, encoding or carrying instructions for execution by the machine 300, and includes digital or analog communications signals or other intangible medium to facilitate communication of such software It should be noted that in some embodiments, optical data switching circuitry may include some or all of the components shown in either FIG. 2 or FIG. 3 or both. It should also be noted that in some embodiments, a computing device may include some or all of the components shown in either FIG. 1 or FIG. 3 or both. In some embodiments, a device (such as the example devices described above and/or others) may include one or more components shown in FIG. 1 and/or FIG. 2 and/or FIG. 3. For instance, in some embodiments, a mobile device may include some components of FIG. 3 and some components of the optical data switching circuitry 111, which may be arranged in a manner similar to the arrangement shown in FIG. 1.

Although the computing device 100, the optical data switching circuitry 111, and the machine 300 are illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements. Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

It should be noted that in some embodiments, an apparatus used by optical data switching circuitry may include various components of the optical data switching circuitry 111 shown in FIG. 2 and/or the computing device shown in FIG. 1 and/or the example machine 300 shown in FIG. 3. Accordingly, in some cases, techniques and operations described herein that refer to the optical data switching circuitry 111 may be applicable to an apparatus for optical data switching circuitry. In some embodiments, an apparatus for a computing device may include various components of the computing device 100 shown in FIG. 1 and/or optical data switching circuitry 111 shown in FIG. 2 and/or the example machine 300 shown in FIG. 3. Accordingly, in some cases, techniques and operations described herein that refer to the computing device 100 may be applicable to an apparatus for a computing device.

In accordance with some embodiments, a processing element 113 of the optical data switching circuitry 111 may generate a plurality of optical data signals and may send the optical data signals to an optical switch 112 of the optical data switching circuitry 111. The optical switch 112 may transmit the optical signals to a router 130 for relay to different destinations. The optical switch 112 may switch between transmission directions for transmission of the optical signals to different receiving ports of the router 130. The receiving ports of the router 130 may be mapped to the different destinations, in some cases. These embodiments will be described in more detail below.

In accordance with some embodiments, a processing element 113 of the optical data switching circuitry 111 may generate a plurality of optical data signals and may send the optical data signals to an optical switch 112 of the optical data switching circuitry 111. In some embodiments, the optical data switching circuitry 111 may include one or more of: a MEMS micro-mirror array 118, and mirror control circuitry 119 to control the MEMS micro-mirror array 118. In some embodiments, the MEMS micro-mirror array 118 and the mirror control circuitry 119 may be included in the optical switch 112, although the scope of embodiments is not limited in this respect.

In some embodiments, the MEMS micro-mirror array 118 may reflect the optical signals (from the processing element 113) to the router 130 for relay to different destinations. In some embodiments, the mirror control circuitry 119 may cause the MEMS micro-mirror array 118 to reflect the optical signals (from the processing element 113) to the router 130 for relay to different destinations. In some embodiments, the mirror control circuitry 119 may control reflection, by the MEMS micro-mirror array 118, of the optical signals (from the processing element 113) to the router 130 for relay to different destinations.

In some embodiments, the MEMS micro-mirror array 118 may switch between reflection directions for reflection of the optical signals to different receiving ports of the router 130. In some embodiments, the mirror control circuitry 119 may cause the MEMS micro-mirror array 118 to switch between reflection directions for reflection of the optical signals to different receiving ports of the router 130. In some embodiments, the mirror control circuitry 119 may control switching, by the MEMS micro-mirror array 118, between reflection directions for reflection of the optical signals to different receiving ports of the router 130.

The receiving ports of the router 130 may be mapped to the different destinations, in some cases. These embodiments will be described in more detail below.

Figure 4:
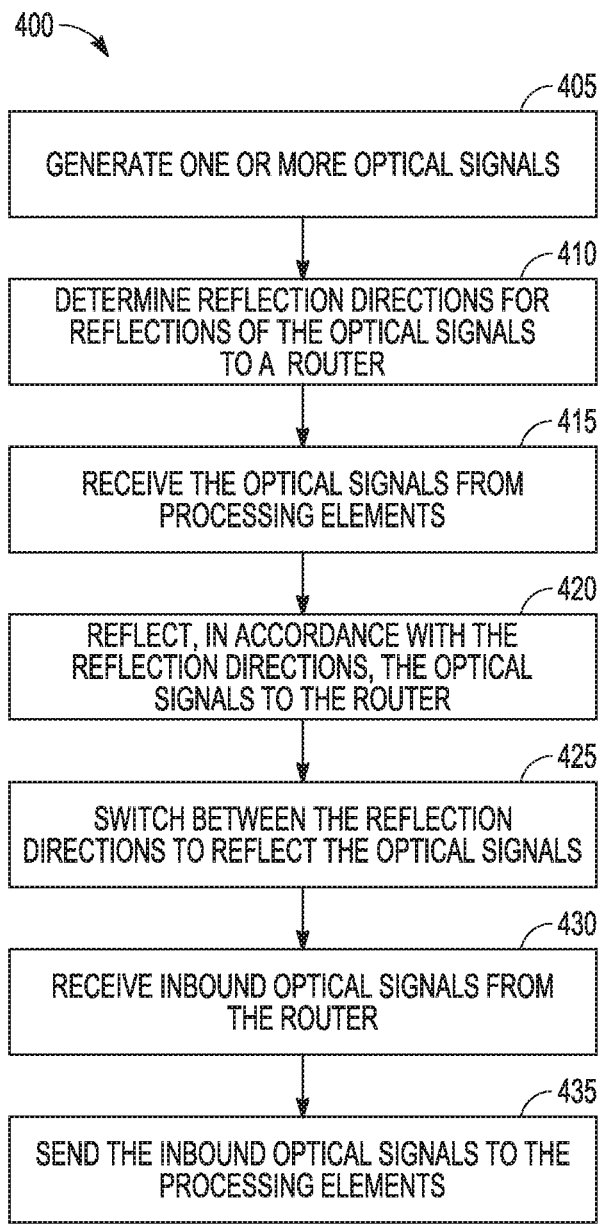
FIG. 4 illustrates the operation of a method of communication of optical signals in accordance with some embodiments.

FIG. 4 illustrates the operation of a method of communication in accordance with some embodiments. In some embodiments, the method 400 may be performed by optical data switching circuitry such as 111, although embodiments are not limited as such and the method 400 may be performed by other devices and/or components in some embodiments. In some embodiments, operations of the method 400 may be performed by components such as optical switches (such as 112, 122, 204 or other), MEMS micro-mirror arrays 118, mirror control circuitry 119 and/or processing elements (such as 113-115, 123-124, 202 or other). Those components may be included in optical data switching circuitry (such as 111 or other) in some embodiments, although embodiments are not limited as such. In descriptions herein of techniques and/or operations, references may be made to components of either the first module 110 and/or second module 120. Such references are not limiting, however, as the techniques and/or operations may be performed by other components (such as components shown in any of FIGS. 1-6), in some embodiments. In addition, references may be made herein to the router 130, but it is understood that these references are not limiting. Accordingly, some operations and/or techniques described herein may be performed using one or more routers in a different arrangement than the arrangement shown in FIG. 1, in some embodiments.

It is important to note that embodiments of the method 400 may include additional or even fewer operations or processes in comparison to what is illustrated in FIG. 4. In addition, embodiments of the method 400 are not necessarily limited to the chronological order that is shown in FIG. 4. In describing the method 400, reference may be made to FIGS. 1-3 and 5-6, although it is understood that the method 400 may be practiced with any other suitable systems, interfaces and components.

It should also be noted that the method 400 may be applicable to an apparatus for optical data switching circuitry, an apparatus for an optical switch, an apparatus for a processing element, an apparatus for a router, an apparatus of a MEMS micro-mirror array, an apparatus of mirror control circuitry and/or an apparatus for another component, in some embodiments. In some embodiments, the modules 110, 120 (and/or components of those modules) and the router 130 may operate as part of a system such as a computing device, computer, super-computer, exascale computer, switch, router, mobile device and/or other device. In some embodiments, the computing device 100 may be or may operate as part of a computer, super-computer, exascale computer, switch, router, mobile device and/or other device. Embodiments are not limited to these examples, however.

In some descriptions herein may refer to performance of one or more operations by the optical switch 112 and optical data switching circuitry 111, but it is understood that one or more other components (including but not limited to the MEMS micro-mirror array 118, mirror control circuitry 119 and other) may perform one or more of those operations, in some embodiments.

At operation 405 of the method 400, a processing element 113 may generate one or more optical signals. At operation 410, the optical switch 112 and mirror control circuitry 119 may determine reflection directions to be used for transmissions of optical signals, such as optical signals that may be received from the processing element 113 at operation 415. In some embodiments, it may be necessary for operation 410 to be performed before operation 415. The intended transmission direction(s) for the optical signals may need to be determined and/or known by the optical switch 112 and mirror control circuitry 119 before the optical signals arrive at the optical switch 112 and mirror control circuitry 119 due to the speed of light.

In some embodiments, the optical switch 112 and mirror control circuitry 119 may determine reflection directions to be used for reflection of the transmissions of the optical signals. For instance, locations of the router 130 may be mapped to different destinations. Accordingly, references herein to reflect in accordance with different directions are not limiting. The optical switch 112 may switch between reflection directions to reflect the optical signals to the different receiving ports of the router 130, in some embodiments.

It should be noted that embodiments are not limited to usage of optical switches, as a MEMS micro-mirror array 118, mirror control circuitry 119 and other components may be used in some embodiments. Accordingly, operations and/or techniques may be described herein with references to an optical switch (such as 112, 122, 204), but it is understood that such references are not limiting, and the operations and/or techniques may also be performed using a MEMS micro-mirror array 118, mirror control circuitry 119 and other components, in some embodiments.

In some embodiments, the optical signals may be sent by the processing element 113 to the optical switch 112 for relay to one or more destinations, such as other components that may or may not be included in the optical data switching circuitry 111. As a non-limiting example, the destination may include another processing element 123 that may be included as part of a different optical data switching circuitry, in some cases. For instance, the processing element 113 that generates the optical signals may be part of the first module 110 (such as a processor board, circuit board or other) and the destination may be a processing element 123 that is part of a second module 120.

It should be noted that embodiments are not limited to a single processing element 113, as the optical switch 112 may receive one or more optical signals from multiple processing elements (such as 114, 115 or other) included in the optical data switching circuitry 111, in some embodiments. In addition, embodiments are also not limited to a single optical switch 112, as the optical data switching circuitry 111 may include multiple optical switches 112, in some embodiments.

Figure 7:
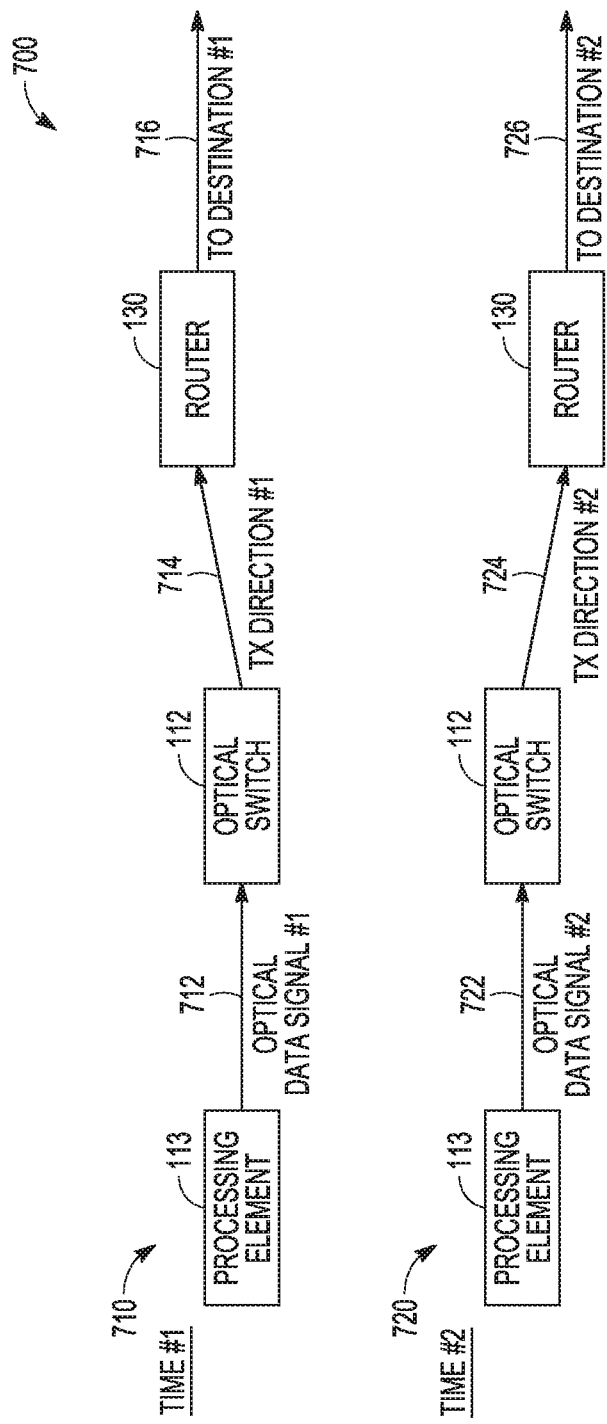
FIG. 7 illustrates example flows of optical signals in accordance with some embodiments.

FIG. 7 illustrates example flows of optical signals in accordance with some embodiments. It is understood that descriptions of FIG. 7 may refer to transmission of optical signals by the optical switch 112, however, reflection of the optical signals (by the optical switch, MEMS micro-mirror array 118, mirror control circuitry 119 and other component(s)) may be used instead of the transmission of the optical signals. The processing element 113 may generate a plurality of optical data signals (such as 712, 722 and/or additional signals) and may send them to the optical switch 112 to be transmitted to the router 130 for relay to different destinations. As indicated by 710, at a first time, a first optical data signal 712 may be sent to the optical switch 112 and may be transmitted by the optical switch 112 to the router 130 in accordance with a first transmission direction 714. The router 130 may relay the first optical data signal 712 to a first destination, as indicated by 716. As indicated by 720, at a second time, a second optical data signal 722 may be sent to the optical switch 112 and may be transmitted by the optical switch 112 to the router 130 in accordance with a second transmission direction 724. The router 130 may relay the second optical data signal 722 to a second destination, as indicated by 726. This example may be extended to any suitable number of optical data signals, times, transmission directions, and destinations. In some embodiments, the optical switch 112 may switch between the transmission directions (714, 724 and/or others) for transmission of the optical data signals (712, 722 and/or others) to different receiving ports of the router 130. The receiving ports of the router 130 may be mapped to different destinations, in some cases.

Figure 5:
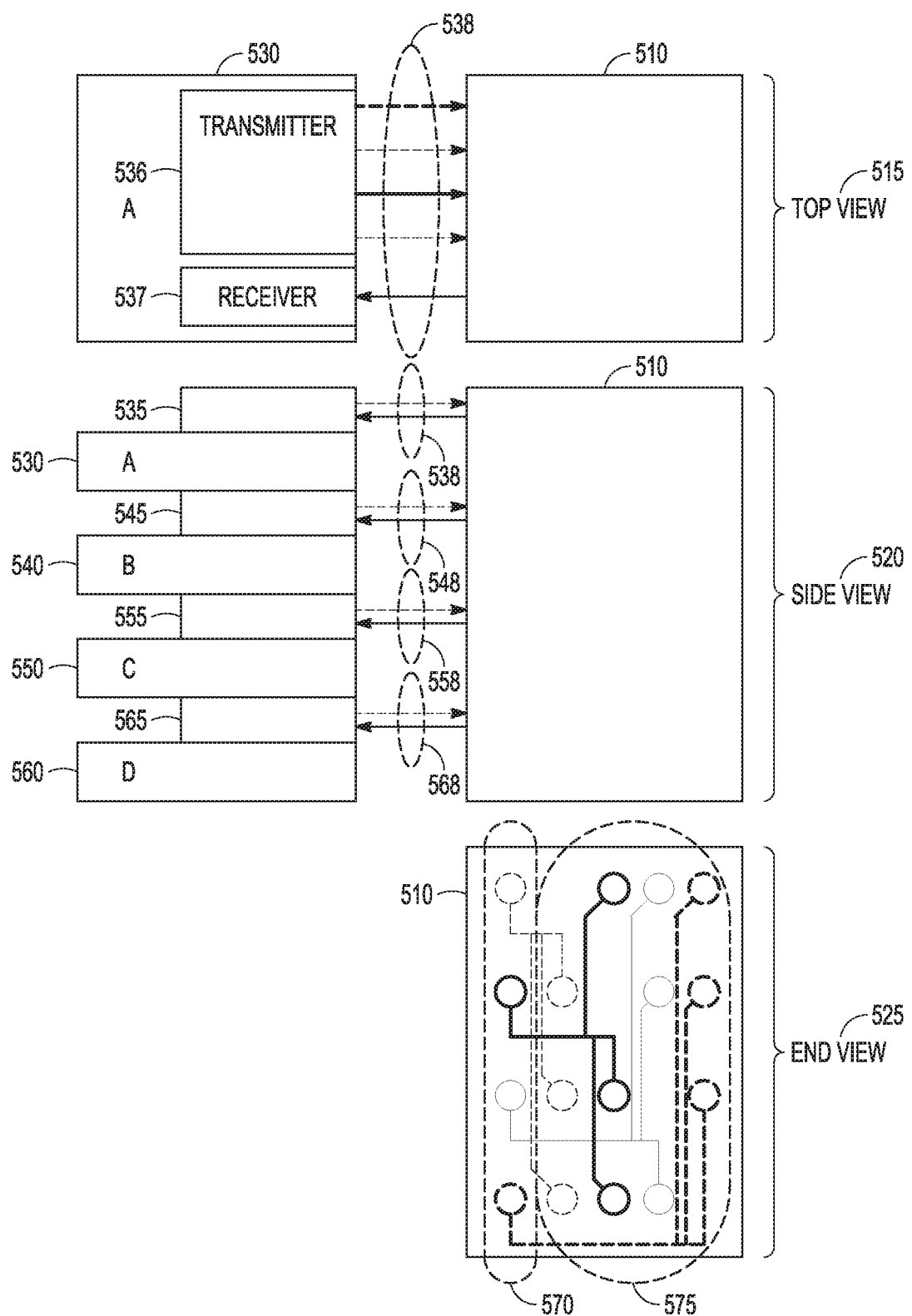
FIG. 5 illustrates an example of optical connectivity between an optical switch and a router in accordance with some embodiments.
Figure 6:
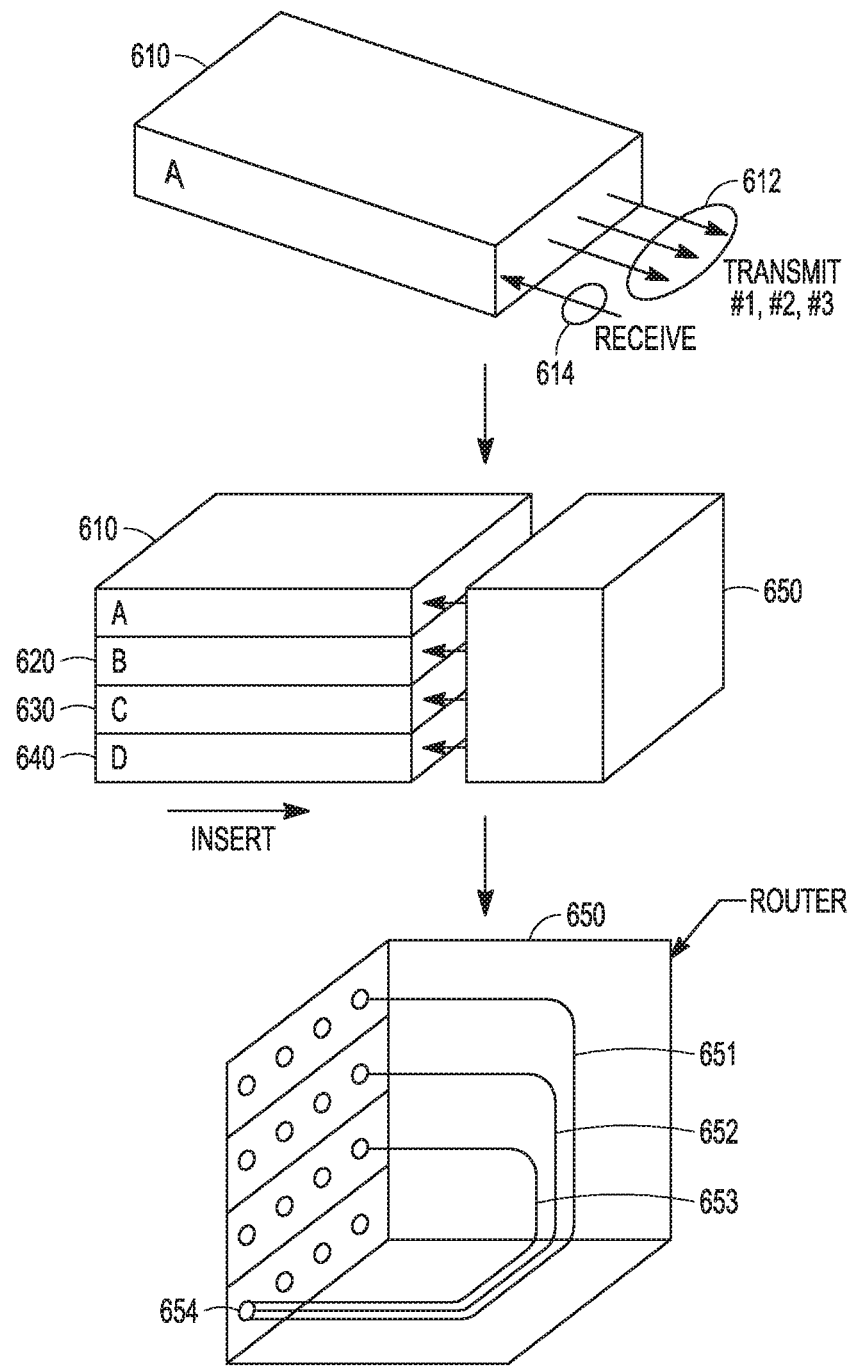
FIG. 6 illustrates another example of optical connectivity between an optical switch and a router in accordance with some embodiments.

In some embodiments, one or more components, such as the MEMS micro-mirror array 118, mirror control circuitry 119 and other, may perform operations that are the same as or similar to operations shown in FIGS. 5-7. For instance, the MEMS micro-mirror array 118 may reflect optical signals in a manner that is similar to operations shown in FIGS. 5-7, in some embodiments. In addition, the mirror control circuitry 119 may provide control functionality to enable the MEMS micro-mirror array 118 to reflect optical signals in a manner that is similar to operations shown in FIGS. 5-7, in some embodiments.

In some embodiments, the optical signals may be based on one or more computed results, outputs or other information that are to be communicated to a destination. In some cases, the processing element 113 may perform one or more computations, may produce one or more outputs, may determine one or more values and/or may perform other operations to generate the optical signal. The optical signal may be based on such computations, outputs and/or values and may also include control information in some cases. The control information may be related to the destination of the optical signal, a route for the optical signal and/or other parameters related to the optical signal. Embodiments are not limited by these examples, however. In some cases, the processing element 113 may receive an optical signal from another component for forwarding and may or may not process the received optical signal before forwarding.

At operation 420 (FIG. 4), the optical switch 112 and/or MEMS micro-mirror array 118 may reflect, in accordance with the reflection directions, the optical signals to the router 130. The optical switch 112 and/or MEMS micro-mirror array 118 may switch between the reflection directions to reflect the optical signals at operation 425. In some embodiments, the optical signals may be reflected to the router 130 for relay to one or more destinations. In some embodiments, the optical switch 112 and/or MEMS micro-mirror array 118 may switch between reflection directions to reflect the optical signals.

It should be noted that embodiments are not limited to usage of fiber optic routers. In some embodiments, a MEMS micro-mirror array 118, mirror control circuitry 119, another router and/or other component may be used as part of router 130. As an example, a system of mirrors and/or a router that includes one or more mirror components may be used. In some embodiments, mirror control circuitry 119 may be used to provide control functionality to the system of mirrors. Accordingly, some operations and/or techniques may be described herein with references to a fiber optic router, but it is understood that such references are not limiting, and the operations and/or techniques may also be performed using other routers and/or components, in some embodiments.

In some embodiments, the reflection directions may be used to reflect the optical signals to different receiving ports of the router 130. In some embodiments, reflection directions between the optical switch 112 (such as a transmitting port of the optical switch 112) and corresponding receiving ports of the router 130 may be used by the optical switch 112 for directional reflection. The receiving ports may be mapped to the destinations of each optical signal, in some cases. Accordingly, reflection to a particular destination may be performed by using a directional reflection to a particular receiving port that is allocated for and/or mapped to communication between the optical switch 112 and the particular destination. Different receiving ports may be allocated for and/or mapped to communication between the optical switch 112 and different destinations. The optical switch 112 may communicate with the different destinations by reflecting to the corresponding receiving ports for those different destinations, in some cases. In some embodiments, an optical connection between the optical switch 112 and the particular receiving port may be used for the communication between the optical switch 112 and the particular destination. Multiple optical connections for the different destinations may enable the optical switch 112 to communicate with the different destinations, in some cases.

For reflection of multiple optical signals to multiple destinations, the optical switch 112 may switch between reflection directions, in some embodiments. Accordingly, the reflection directions may be switched in accordance with a relationship (such as a predetermined mapping or other mapping) between the receiving ports and the destinations. The reflection directions may be switched to enable the optical switch 112 to reflect to different receiving ports and/or to aim the reflection at the different receiving ports. As a non-limiting example, the reflections of the multiple optical signals to the multiple destinations may include sequential reflections performed in non-overlapping time periods, in some cases.

In some embodiments, the optical switch 112 may be optically coupled to the router 130. As an example, a transmitting port of the optical switch 112 may be optically coupled to receiving ports of the router 130. Accordingly, multiple optical connections (which may be represented by 118 in FIG. 1) between the transmitting port of the optical switch 112 and the receiving ports of the router 130 may be used for communication. In addition, in some embodiments, a receiving port of the optical switch 112 may be optically coupled to transmitting ports of the router 130, and optical connections between the receiving port of the optical switch 112 and the transmitting ports of the router 130 may be used for communication. The optical coupling may include free space optical coupling, in some embodiments.

In some embodiments, the optical switch 112 and/or MEMS micro-mirror array 118 may reflect and/or steer transmitted optical signals and/or beams between the receiving ports of the router 130, in some embodiments. Accordingly, the optical switch 112 and/or MEMS micro-mirror array 118 may reflect and/or steer optical signals and/or beams between different optical connections between the optical switch 112 and the receiving ports of the router 130, in some cases. In some embodiments, the optical switch 112 and/or MEMS micro-mirror array 118 may switch between the reflection directions for the reflection of the optical signals over different optical connections between the optical switch 112/MEMS micro-mirror array 118 and different receiving ports of the router 130, in some embodiments. The optical signals may be steered and/or transmitted over the optical connections in accordance with a free space optical coupling between the receiving ports and the optical switch 112, in some embodiments.

The optical switch 112 may steer reflected optical signals and/or beams between the receiving ports, in some embodiments. The optical switch 112 may switch between the reflection directions for the reflection of the optical signals over different optical connections between the optical switch 112 and different receiving ports of the router 130, in some embodiments. The optical signals may be transmitted over the optical connections in accordance with a free space optical coupling between the receiving ports and the optical switch 112, in some embodiments.

In some embodiments, the receiving ports may be mapped to different destinations. Such a mapping may be a predetermined mapping or a mapping done at the router 130, in some cases. As an example, a first receiving port of the router 130 may be used by the router 130 to receive a first optical signal from the optical switch 112 for relay to a first destination. The router 130 may route the received first optical signal to a particular transmitting port of the router 130 that is mapped as a transmitting port for transmission of optical signals to the first destination (or another optical switch that may relay the optical signals to the first destination). For instance, the first destination may be the processing element 123 of the second module 120, and the router 130 may transmit the first optical signal to the optical switch 122 for relay to the processing element 123.

Continuing the previous example, a second receiving port of the router 130 may be used in a similar manner by the router 130 to transmit optical signals from the optical switch 112 to a second destination (or to another optical switch for relay to the second destination). Additional receiving ports may be allocated in a similar manner to enable communication of optical signals from the optical switch 112 to any suitable number of destinations.

As another example, other receiving ports of the router 130 may be used in a similar manner to communicate optical signals from other optical signals to various destinations. As a non-limiting example, the router 130 may be configured to relay optical signals between any combination of four modules, A-D, each of which may comprise an optical switch and one or more processing elements. The first module A (which may be the first module 110 in FIG. 1) may communicate optical signals to B, C or D. Accordingly, the router 130 may allocate a receiving port for communication from A to B (which may be the second module 120 in FIG. 1), a receiving port for communication from A to C, and a receiving port for communication from A to D. Similarly, the router 130 may allocate a receiving port for communication from B to A, a receiving port for communication from B to C, and a receiving port for communication from B to D. Additional receiving ports may be allocated for communication from C to modules A, B, and D, and for communication from D to A, B, and C. The router 130 may allocate corresponding transmitting ports for each communication described above, and such routing may be performed internal to the router 130, in some embodiments. It is understood that some descriptions may refer to transmission of optical signals by the optical switch 112, however, reflection of the optical signals (by the optical switch, MEMS micro-mirror array 118, mirror control circuitry 119 and other component(s)) may be used instead of the transmission of the optical signals.

In some embodiments, the optical switch 112 may be configured to transmit in accordance with a particular transmission direction based on one or more control signals applied to the optical switch 112, the MEMS micro-mirror array 118 or the mirror control circuitry 119. The control signals may, for example, comprise digital signals or analog signals (e.g., voltage levels). As an example, a control signal may indicate which transmission direction and/or which receiving port of the router 130 is to be used for a transmission of a particular optical signal. Accordingly, a switch in the control signal may indicate, to the optical switch 112, to switch between transmission directions. The transmission directions may be mapped to the control signals in a predetermined manner, in some cases, although the scope of embodiments is not limited in this respect. It should also be noted that embodiments are not limited to usage of control signals, as the optical switch 112 may determine a transmission direction or may determine that the transmission direction is to be switched based on other factors. For instance, the optical switch 112 may use control information in the optical signals to make such a determination, in some embodiments.

In some embodiments, the optical switch 112 may switch transmission directions and/or steer transmissions of optical signals in accordance with a high-speed switching. A switching time for switching between two transmission directions, such as a maximum time, typical time and/or average time, may affect performance. In some embodiments, the transmission direction may be switched according to a particular increment, such as an increment of up/down angle, left/right angle and/or distance, within a particular time interval. The increment may be different for different combinations of first and second transmission directions, and a switching time may also vary accordingly. As an example, a first switching time may occur for a switch between transmission directions for two receiving ports located next to each other in a grid of the router 130. A second switching time may occur for a switch between transmission directions for two receiving ports located at opposite ends of the grid. The first switching time may be lower than the second switching time, in some cases. As a non-limiting example, for high-speed switching, the first switching time may be less than one micro-second and the second switching time may be less than 20 microseconds. It should be noted that embodiments are not limited by these example numbers, as other suitable numbers may be used in some cases. It is understood that some descriptions may refer to transmission of optical signals by the optical switch 112, however, reflection of the optical signals (by the optical switch, MEMS micro-mirror array 118, mirror control circuitry 119 and/or other component(s)) may be used instead of the transmission of the optical signals.

It should be noted that in some embodiments, the optical switch 112 may transmit/reflect optical signals received from multiple processing elements (like 113-115 in the example of FIG. 1) and/or receive optical signals intended for multiple processing elements (like 113-115). For instance, the first module may include the optical switch 112 and multiple processing elements 113-115. Accordingly, embodiments are not limited to usage of a single processing element 113. Although some operations may be described herein in terms of one processing element 113, it is understood that those operations and/or similar operations may be performed for multiple processing elements (like 113-115).

As an example, the optical switch 112 may receive a first group of optical signals from a first processing element 113 and may transmit the first group of optical signals to the router 130 for relay to one or more destinations. The optical switch 112 may also receive a second group of optical signals from a second processing element 114 and may transmit the second group of optical signals to the router 130 for relay to one or more destinations. In some cases, the optical switch 112 may transmit optical signals in the first group and optical signals in the second group during a same time period and in a sequential manner, although the scope of embodiments is not limited in this respect. For instance, the optical switch 112 may transmit one or more optical signals from the first group, followed by one or more optical signals from the second group, followed by one or more additional optical signals from the first group. That is, the optical switch 112 may alternate between the two groups of optical signals. It should be noted that some embodiments and/or examples may be extended to more than two processing elements. It is understood that some descriptions may refer to transmission of optical signals by the optical switch 112, however, reflection of the optical signals (by the optical switch, MEMS micro-mirror array 118, mirror control circuitry 119 and/or other component(s)) may be used instead of the transmission of the optical signals.

Returning to the method 400 (FIG. 4), the optical switch 112 may receive one or more inbound optical signals from the router 130 for relay to the processing element 113 at operation 430. The optical switch 112 may send the optical signals to the processing element 113 at operation 435. In some cases, the optical switch 112 may operate as a relay to communicate the inbound optical signals from one or more sources to the processing element 113. The sources may include processing elements of other modules (such as processing elements 123-124 of the second module 120) and/or one or more destinations from previously described operations. It should be noted that embodiments are not limited to usage of a single processing element 113. In some embodiments, the optical switch 112 may receive inbound optical signals for multiple processing elements of the module (such as 113-115 of the first module 110), may send those inbound optical signals to the multiple processing elements (such as 113-115) and/or may operate as a relay for communication of inbound signals from one or more sources to multiple processing elements (such as 113-115).

In some embodiments, the inbound optical signals may be or may include acknowledgement signals. As an example, an acknowledgement signal may indicate information about whether or not packets of a previously transmitted optical signal are successfully received by a destination. As another example, an acknowledgement signal may indicate information about the path between the optical switch 112 and the destination. For instance, the transmission direction used to transmit to the router 130 may be tuned, adjusted, optimized and/or improved by exchanging of signals between the optical switch 112 and the router 130. In addition, a mapping between transmission directions and the receiving ports may be determined using such techniques. Other mappings, such as mappings between transmission directions and destinations, may also be determined using such techniques.

FIGS. 5 and 6 illustrate examples of optical connectivity between an optical switch and a router in accordance with some embodiments. It is understood that descriptions of FIGS. 5-6 may refer to transmission of optical signals by the optical switch 112, however, reflection of the optical signals (by the optical switch, MEMS micro-mirror array 118, mirror control circuitry 119 and other component(s)) may be used instead of the transmission of the optical signals.

It should be noted that embodiments are not limited to the examples of connectivity 500 or 600 shown in FIGS. 5 and 6, in terms of number, type and/or arrangement of components. As an example, four modules 530, 540, 550, and 560 (denoted as A-D) may be arranged in stack configuration and may communicate with each other through the router 510. Embodiments are not limited to the stack configuration and are also not limited to four modules. In the example connectivity shown in FIG. 5, a top view 515, side view 520, and end view 525 are shown. In some embodiments, the modules may be arranged in a stack arrangement adjacent to the router with reflective and/or transmissive optical elements that provide optical transmission paths between the optical switches and the receiving ports of the router. In some embodiments, the modules may be arranged in stacks, layers or a combination of stacks and layers adjacent or surrounding the router. In these embodiments, reflective and/or transmissive optical elements may provide optical transmission paths between the optical switches and/or the MEMS micro-mirror arrays and the receiving ports.

The module 530 may include an optical switch 535. In some cases, the optical switch 535 may include one or more transmission ports 536 and one or more receiving ports 537. The top view 515 and side view 520 show communication (denoted by 538) between the optical switch 535 and the router 510. The other modules 540, 550, 560 may also include an optical switch (shown as 545, 555, and 565) and may communicate with the router as denoted by 548, 558, and 568. Routing of the signals between the receiving ports 570 of the router and the transmitting ports 575 of the router are shown in the end view 525.

FIG. 6 illustrates another example of optical connectivity between an optical switch and a router in accordance with some embodiments. The transmit/receive (T/R) module 610 (labeled as A) and the modules 620-640 (labeled as B, C, and D) may be arranged in a stack configuration and connected to a router 650. As shown in the bottom portion of FIG. 6, the router may route received signals from modules 610, 620, and 630 (shown as 651, 652, and 653) to a transmitting port 654 for transmission to module 640. Similar connectivity for transmission to the other modules 610, 620, and 630 may also be implemented, in some cases.

In some embodiments, free space optical data coupling from each of multiple processor boards to a router may be utilized. There may be one transmitter/receiver (T/R) module for each processor board, in some cases. In some embodiments, optical data from the transmitter module may be switched by an optical switch. As an example, a MEMS micro-mirror array may be used in some cases. These examples are not limiting, as other types of optical switches are possible in some cases. The optical switch may steer the transmitter laser beam to the port for the desired processor board receiver. There may be one receiver for each processor board that may receive, from the router, data from other boards. Referring to the end view 525 of FIG. 5 as an example, fiber optic cables from processor boards A, B and C may be combined (for example, by splicing) in the router 510 to route the data to the receiver for processor board D. Similar fiber optic cabling for the data going to each of the other processor boards in the stack may be used.

In some embodiments, high-speed switching may be performed by the optical switch comprising a MEMS micro-mirror array. As an example, the optical switch may switch from one spot to another in a few microseconds, and a maximum time may be about 20 microseconds. In some embodiments, scalability may be realized. As an example, the optical switch may steer the laser beams to 400 spots, in some cases. In some cases, the optical switch may utilize a relatively low power consumption and may require little cooling.

In some embodiments, free space optical coupling between the router and the boards may be used. Accordingly, the optical connections may be made without a need for access to the back side of the board, in some cases. In some cases, optical data may be switched between many processors. In some cases, an order of magnitude more processors may be connected for parallel processing in comparison to other devices. In some cases, high-speed data optical switching may be realized. In some cases, techniques described herein may be used as part of "big data" processing systems and/or data centers.

It should be noted that one or more devices and/or embodiments descried herein may include one or more of: a MEMS micro-mirror array, circuitry related to MEMS, one or more mirrors, one or more mirrors configured to perform one or more operations such as reflection, mirror control circuitry, control circuitry that is configured to perform at least one control for a component (such as the MEMS micro-mirror array, circuitry related to MEMS, one or more mirrors, one or more mirrors configured to perform reflection and/or other operations, and/or other component(s)), and/or other.

In addition, one or more devices and/or embodiments described herein may be related to: usage of a MEMS micro-mirror array capable of digitally controlling light; control circuitry for controlling the array; means for controlling the array; a digitally controlled MEMS array; and/or similar.

In addition, one or more devices and/or embodiments described herein may be related to the following. In some cases, the MEMS micro-mirror array may enable a much wider range of wavelengths compared to a waveguide, liquid crystal waveguide (LCWG) because only the coatings may need to be changed, not the entire material system. Emerging MEMS micro-mirror arrays also nearly completely fill the aperture and have both tilt and piston control. Completely filling the aperture increases the sensor throughput. The piston control adds the capability to correct the wavefront to mitigate the effects of atmospheric absorption, scatter and thermal blooming and optical distortion that degrade the sensor performance.

It should be noted that some descriptions herein may refer to performance of one or more operations by a component such as an optical switch, optical data switching circuitry, and/or other component. It is understood that one or more other components (including but not limited to a MEMS micro-mirror array, mirror control circuitry and/or other) may perform one or more of those operations, in some embodiments.

In some embodiments, a MEMS micro-mirror array may reflect optical signals. In some embodiments, mirror control circuitry may provide control functionality for the MEMS micro-mirror array to reflect the optical signals. It is understood that in some embodiments, a MEMS micro-mirror array may perform one or more of the same operations and/or similar operations, wherein the MEMS micro-mirror array reflects optical signals. The mirror control circuitry may perform control functionality for one or more of those operations, although the scope of embodiments is not limited in this respect.

In some embodiments described herein, operations related to "steering of optical signals" or "transmission of optical signals" or similar may be related to "reflection of optical signals by a MEMS micro-mirror array". For instance, in some embodiments, reflection by the MEMS micro-mirror array may replace steering by a LCWG in one or more of the described embodiments.

While several illustrative embodiments of the invention have been shown and described, numerous variations and alternate embodiments will occur to those skilled in the art. Such variations and alternate embodiments are contemplated and can be made without departing from the spirit and scope of the invention as defined herein.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

The invention claimed is:

1. Optical data switching circuitry, comprising:
a processing element, configured to generate a plurality of optical signals; and
an optical switch comprising a micro-electronic mechanical system (MEMS) micro-mirror array, configured to:
reflect the optical signals to a router for relay to different destinations; and
switch between reflection locations for reflection of the optical signals over different optical connections for the destinations, the optical connections between the optical switch and different receiving ports of the router,
wherein the optical signals are sequentially switched between different transmission directions to the different receiving ports of the router in non-overlapping time periods in accordance with a predetermined mapping between the transmission directions and the receiving ports.

2. The optical data switching circuitry according to claim 1, wherein the reflection locations are switched in accordance with a high-speed switching for which a switching time is 20 micro-seconds or less.

3. The optical data switching circuitry according to claim 1, wherein the optical signals are reflected over the optical connections in accordance with a free space optical coupling between the receiving ports and the optical switch.

4. The optical data switching circuitry according to claim 1, wherein the optical switch is further configured to switch between the reflection locations based on a predetermined mapping between the reflection locations and a control voltage and/or control signals applied to the optical switch.

5. The optical data switching circuitry according to claim 1, wherein the optical switch is further configured to switch between the reflection locations based on destination indicators included in data packets of the optical data signals.

6. The optical data switching circuitry according to claim 1, wherein the router comprises: a second MEMS micro-mirror array; and mirror control circuitry to control the second MEMS micro-mirror array.

7. The optical data switching circuitry according to claim 1, wherein the router is a fiber optic router.

8. The optical data switching circuitry according to claim 1, wherein:
the plurality of optical signals is a first plurality of optical signals,
the optical data switching circuitry further comprises one or more other processing elements, and
the optical switch is further configured to:
reflect a second plurality of optical signals from the other processing elements to the router for relay to the destinations; and
switch between the reflection locations for the reflection of the second plurality of optical signals over the optical connections.

9. The optical data switching circuitry according to claim 1, the optical switch further configured to:
receive a plurality of inbound optical signals from the router for elay to the processing element; and
switch between receive directions for the reception of the inbound optical signals over different inbound optical connections between the optical switch and different transmitting ports of the router,
wherein the receive directions are switched in accordance with a predetermined mapping between the transmitting ports and a group of sources of the inbound optical signals, and
wherein the inbound optical signals are received over the inbound optical connections in accordance with a free space optical coupling between the transmitting ports and the optical switch.

10. The optical data switching circuitry according to claim 9, wherein the received inbound optical signals include an acknowledgement signal from one of the destinations, the acknowledgement signal based on a reception of one of the optical signals at the destination.

11. Optical data switching circuitry, comprising:
a processing element, configured to generate a plurality of optical signals; and
an optical switch comprising a micro-electronic mechanical system (MEMS) micro-mirror array, configured to:
reflect the optical signals to a router for relay to different destinations; and
switch between reflection locations for reflection of the optical signals over different optical connections for the destinations, the optical connections between the optical switch and different receiving ports of the router,
wherein the reflection locations are switched in accordance with a predetermined mapping between the receiving ports and the destinations,
wherein:
the plurality of optical signals is a first plurality of optical signals,
the optical data switching circuitry further comprises one or more other processing elements, and
the optical switch is further configured to:
reflect a second plurality of optical signals from the other processing elements to the router for relay to the destinations; and
switch between the reflection locations for the reflection of the second plurality of optical signals over the optical connections, and
wherein the optical switch is configured to reflect at least a portion of the first plurality of optical signals and at least a portion of the second plurality of optical signals sequentially and during a same time period.

12. Optical data switching circuitry, comprising:
a processing element, configured to generate a plurality of optical data signals;
a micro-electronic mechanical system (MEMS) micro-mirror array, configured to reflect the optical data signals to different receiving ports of a router for relay to different destinations,
wherein the optical signals are sequentially switched between different transmission directions to the different receiving ports of the router in non-overlapping time periods in accordance with a predetermined mapping between the transmission directions and the receiving ports.

13. The optical data switching circuitry according to claim 12, wherein the MEMS micro-mirror array is further configured to receive the optical data signals from the processing element.

14. The optical data switching circuitry according to claim 12, wherein the MEMS micro-mirror array is further configured to reflect the optical data signals to the receiving ports of the router in accordance with different directions between the MEMS micro-mirror array and the receiving ports.

15. The optical data switching circuitry according to claim 14, wherein the MEMS micro-mirror array is further configured to reflect the optical data signals in accordance with a predetermined mapping between the directions and one or more control voltages applied to the optical switch.

16. The optical data switching circuitry according to claim 12, wherein:
the processing element is a first processing element and the plurality of optical data signals is a first plurality of optical data signals,
the MEMS micro-mirror array is further configured to reflect a second plurality of optical data signals from a second processing element of the optical data switching circuitry to the router for relay to the destinations, and
the reflections of the second optical data signals are steered between the receiving ports in accordance with the predetermined mapping between the receiving ports and the destinations.

17. The optical data switching circuitry according to claim 12, wherein the MEMS micro-mirror array is configured to operate as a relay by receiving incoming optical data signals intended for the processing element from the router, and by reflecting the incoming optical data signals to the processing element.

18. The optical data switching circuitry according to claim 12, wherein the router comprises one or more MEMS micro-mirror arrays.

19. The optical data switching circuitry according to claim 12, wherein the router is a fiber optic router.

20. An optical data communication apparatus, the apparatus comprising:
optical switches; and
a router, configured to operate as a relay to exchange optical data signals between the optical switches,
wherein the optical switches are configured to switch between reflection directions to reflect the optical signals over different optical connections between the optical switches and different receiving ports of the router, wherein the router includes a micro-electronic mechanical system (MEMS) micro-mirror array configured to reflect received optical signals to the destinations; and wherein the optical signals are sequentially switched between different transmission directions to the different receiving ports of the router in non-overlapping time periods in accordance with a predetermined mapping between the transmission directions and the different receiving ports.

21. The communication apparatus according to claim 20, wherein the MEMS micro-mirror array comprises a system of mirror elements configured to reflect the received optical signals to the destinations.

22. The communication apparatus according to claim 20, wherein the reflection directions are switched in accordance with a high-speed switching for which a switching time is 20 micro-seconds or less.

23. The communication apparatus according to claim 20, wherein the optical signals are reflected over the optical connections in accordance with a free space optical coupling between the receiving ports and the optical switch.

24. The communication apparatus according to claim 20, wherein the optical switches are further configured to switch between the reflection directions based on predetermined mappings between the reflection directions and control voltages applied to the optical switches.

25. The communication apparatus according to claim 20, wherein:

the communication apparatus comprises multiple modules, and each of the modules comprises one of the optical switches and a group of one or more processing elements to generate the optical signals.

26. The communication apparatus according to claim 25, wherein the modules are arranged in a stack arrangement adjacent to the router with reflective and/or transmissive optical elements that provide optical transmission paths between the optical switches and the receiving ports of the router.

27. The communication apparatus according to claim 20, wherein the optical switches include one or more MEMS micro-mirror arrays and/or mirror control circuitry to provide control functionality for the one or more MEMS micro-mirror arrays.

28. The communication apparatus according to claim 20, wherein the communication apparatus is an exascale computing device.

* * * * *

UNITED STATES PATENT AND TRADEMARK OFFICE
CERTIFICATE OF CORRECTION

PATENT NO. : 11,042,025 B2
APPLICATION NO. : 16/871602
DATED : June 22, 2021
INVENTOR(S) : Uyeno et al.

It is certified that error appears in the above-identified patent and that said Letters Patent is hereby corrected as shown below:

In the Specification

Column 2, Line 19, delete "110." and insert --120.-- therefor

Column 4, Line 47, delete "(USB)," and insert --(USB)),-- therefor

Column 15, Line 31, delete "descried" and insert --described-- therefor

In the Claims

Column 17, Line 24, Claim 9, delete "elay" and insert --relay-- therefor

Column 18, Line 62, Claim 20, before "signals", delete "data"

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*